US005153915A

United States Patent [19]

Farella

[11] Patent Number: 5,153,915

[45] Date of Patent: Oct. 6, 1992

[54] SPEAKER FILTERING CIRCUIT AND SUPPORT THEREFOR

[75] Inventor: Michael P. Farella, Flushing, N.Y.

[73] Assignee: Creative Acoustics, Inc., Hollis, N.Y.

[21] Appl. No.: 525,865

[22] Filed: May 18, 1990

[51] Int. Cl.[5] ........................ H04R 25/00; H03G 5/00; H05K 5/00

[52] U.S. Cl. .................................... 381/205; 381/188; 381/88; 381/99; 181/150

[58] Field of Search ............... 381/199, 201, 200, 188, 381/205, 88, 90, 99, 194, 195; 181/148, 150; 340/388

[56] References Cited

U.S. PATENT DOCUMENTS

| | | | |
|---|---|---|---|
| D. 238,185 | 12/1975 | Wellward . | |
| D. 242,151 | 11/1976 | Wellward . | |
| D. 247,562 | 3/1978 | Walker et al. . | |
| D. 255,234 | 6/1980 | Wellward et al. . | |
| 2,070,977 | 2/1937 | Quinnell . | |
| 2,727,949 | 12/1955 | Lokkesmoe | 381/98 |
| 2,770,681 | 11/1956 | Perry | 381/199 |
| 3,798,389 | 3/1974 | Tokizaki | 381/187 |
| 4,072,829 | 2/1978 | Ogihara . | |
| 4,143,249 | 3/1979 | Cinquino . | |
| 4,149,153 | 4/1979 | Shigemori et al. | 340/388 |
| 4,163,223 | 7/1979 | Sato et al. | 340/388 |
| 4,220,832 | 9/1980 | Nagel | 381/195 |
| 4,385,210 | 5/1983 | Marquiss | 381/199 |
| 4,439,643 | 3/1984 | Schweizer . | |
| 4,484,658 | 11/1984 | Grote | 181/150 |
| 4,492,826 | 1/1985 | Chiu | 381/188 |
| 4,606,071 | 8/1986 | White, Jr. | 381/99 |
| 4,672,675 | 6/1987 | Powell et al. | 381/182 |
| 4,733,748 | 3/1988 | Ponticelli, Jr. | 181/141 |
| 4,837,839 | 6/1989 | Andrews | 381/199 |
| 4,901,357 | 2/1990 | Albright | 381/199 |

*Primary Examiner*—James L. Dwyer
*Assistant Examiner*—Jason Chan
*Attorney, Agent, or Firm*—Dilworth & Barrese

[57] ABSTRACT

A coaxial speaker system having a high frequency component and a low frequency component is provided with a filtering circuit having an inductance coil securely mounted upon a magnet of the coaxial speaker. Mounting of this filtering circuit permits tuning of the coaxial speaker to provide a desired decibel level over a midrange frequency between the high frequency and low frequency components.

14 Claims, 14 Drawing Sheets

SPEAKER FILTERING CIRCUIT AND SUPPORT THEREFOR

BACKGROUND OF THE INVENTION

1. Field of the Invention

The present invention is directed to a new and improved filtering circuit for a speaker, and also to a new and improved speaker system.

More particularly, the present invention is directed to a new and improved filtering network especially for a coaxial speaker system, and to such a new and improved coaxial speaker system, in which the filtering network, notably the inductance coil thereof, can be securely and successfully mounted coaxially upon a magnet of the coaxial speaker, with little or no disadvantage and with great improvement in audio reception and in structural balance of such a speaker system.

2. Description of the Prior Art

Audio speakers for delivering sound reception from a source such as a microphone, radio, tape deck, etc. have been known for quite some time, and it has been desirable to mount such speakers in any number of different fashions, e.g., upon the ceiling or a ceiling panel, on a wall, or on part of an automobile. For example, Design Patent Nos. 238,185; 242,151; 247,562; and 255,234 illustrate designs for ceiling-mounted speakers, while U.S. Pat. Nos. 4,072,829; 4,143,249; and 4,439,643 illustrate mounting attachments for loudspeakers. U.S. Pat. No. 4,484,658 illustrates a support assembly for a speaker upon a ceiling panel.

Recently, multiple speakers containing a larger speaker component and a smaller speaker component have come into particular use to enhance sound delivery. For example, such multiple speakers are disclosed in U.S. Pat. Nos. 4,837,839 and 4,672,675. U.S. Pat. No. 4,733,748 also discloses a mounting device for a car radio loudspeaker, as does U.S. Pat. No. 4,143,249. U.S. Pat. No. 2,070,977 also discloses a relatively primitive version of a sound reproducing speaker.

In particular, a coaxial speaker involves mounting a smaller speaker component within a larger speaker component along the same axis, which greatly enhances delivery of audio reception. Such a smaller speaker component is termed a "high frequency" speaker or tweeter, in that such a smaller component blocks out delivery of sound of a relatively lower frequency range, while the larger speaker component is termed a "low frequency" speaker or woofer, in that such larger component either blocks out only high frequencies or is designed to receive the entire frequency range of sound, including low, mid-range and high frequencies. Such coaxial speakers also encompass a triaxial speaker in which a midrange speaker and a tweeter are both mounted upon a woofer as disclosed, e.g., in U.S. Pat. Nos. 4,672,675 and 4,837;839.

Because of the nature of sound delivery, it has been necessary to provide such coaxial-type speakers with a filtering network such as RLC filtering circuitry (R=resistor, L=inductor, and C=capacitor), in order to properly filter the sound between the woofer and tweeter components, and also the midrange component in the case of the triaxial-type speaker, to avoid distortion as much as possible. In other words, if such speaker components are used without such appropriate RLC filter circuitry, then the sound delivery over a middle or overlapping range between the woofer and tweeter will be magnified or multiplied, resulting in distortion of sound and in undesirable noise and audio effect. Accordingly, such filter circuitry has been required, at the very least, to stop the higher frequency sound from reaching the woofer, and directing such higher frequency sound to the tweeter component which in turn is blocked from receiving all but the requisite high frequency audio delivery.

Such filter circuitry has generally comprised, as noted above, an inductor or inductance coil, a resistor, and a capacitor. In particular, the inductor coil generally requires several large turns or windings, e.g. on the order of about 50 to 250 such windings to provide adequate control or filtering of a coaxial speaker having two components and a basket of about 6.5 inches diameter. In other words, such an RLC filtering circuitry is quite expansive and bulky. Therefore, in previously-known speakers of the non-coaxial type, such RLC circuitry was either mounted within a large container for the speakers separate and apart from the actual speaker components and diaphragms thereof, or mounted remote from such units and provided with separate control lines leading to the speaker units.

In recent times, need for versatility in mounting of speaker components has increased. It has become desirable to mount such speaker components at specific locations in an automobile, along walls of a room, and notably upon ceiling panels or the ceiling within a room, to greatly enhance delivery of audio reception. In particular, conversion of pre-existing lighting fixtures to audio speakers has become of paramount interest in recent years, in order to enhance delivery of sound reception. There has been a great deal of interest in successfully mounting coaxial-type speakers upon a ceiling panel. However, it has not been previously possible to successfully mount such speakers and, at the same time, provide required audio reception, because it had not been possible to successfully mount a filtering network in conjunction therewith.

Since such RLC filtering network or circuitry is quite cumbersome and bulky, such circuitry would either have to be positioned upon a ceiling panel, greatly increasing the weight and the unwieldiness of the entire sound system, or such filtering circuitry would have to be mounted quite remote to the ceiling-mounted speaker, e.g. upon a wall of a room, and then coupled to the ceiling mounted speakers through separate lines or wires, also quite cumbersome and bulky, because, e.g., long connecting wires would be required between the filtering circuit and the speaker, resulting in increased potential failure of such circuitry.

Therefore, it had not been previously possible to feasibly mount a coaxial speaker with an adequate filtering system upon a ceiling panel, especially when such ceiling panel has been provided with a recessed baffle thereupon. If such speaker system was used without any RLC filter circuitry, then a tremendous amount of distortion resulted and sound quality emanating from the non-filtered speaker components was extremely poor or totally unacceptable.

However, it has now been found that it is possible to feasibly provide RLC filter circuitry in conjunction with a coaxial-type speaker, especially when such speaker is mounted upon a ceiling panel or a recessed ceiling baffle, securely and optimally providing the required filtering, while at the same time enhancing the overall structural positioning and arrangement of such a coaxial speaker system with maximum stability and reliability.

SUMMARY OF THE INVENTION

Accordingly, it is an object of the present invention to improve delivery of sound, notably from an electrical audio system.

It is also an object of the present invention to improve mounting of filter speaker circuitry upon components.

It is an additional object of the present invention to minimize or eliminate distortion that would result from mounting of a coaxial-type speaker upon recessed mounting structure such as a ceiling baffle.

It is a further object of the present invention to improve sound delivery over the full frequency range of a coaxial-type speaker component, especially when such speaker component is mounted upon the ceiling or a ceiling panel or baffle.

These and other objects are attained by the present invention which is directed to a filtering circuit for a speaker, in which the filtering circuit comprises an inductance coil shaped and positioned to fit over the magnet of the speaker. When the inductance coil is shaped and positioned to securely fit upon the speaker magnet, then compensation of acoustical distortion that would be caused by a particular mounting structure for the speaker, such as a recessed ceiling baffle, is facilitated. It is now possible to use different shapes and forms of mounting structure for the speaker which was previously disadvantageous because such structure caused unnatural amplification of the midrange frequencies of such a speaker.

Additionally, a resistor and/or a capacitor can be included in the filtering circuitry to further enhance frequency response. The inductance coil can be shaped and positioned to be mounted about a permanent magnet of the speaker. Furthermore, a separate resistor, capacitor, and inductance coil may be mounted in series, to enhance filtering between speaker components of a coaxial speaker, with all such filtering components being mounted in close proximity to the coaxial speaker or directly upon the coaxial speaker itself.

It has now been found that when such an inductance coil of the RLC filtering circuitry is securely positioned upon a magnet of a speaker such as the permanent magnet of a coaxial speaker, the inductance does not markedly decrease, and in most cases just slightly decreases, e.g. on the order of about 5% or less. Positioning of such a coil upon the permanent magnet of the coaxial speaker, notably when such a speaker is mounted facing downwardly upon a ceiling panel or ceiling baffle, enhances the stability and space savings of such a system while at the same time improving the frequency response between the speaker components, enhancing the entire audio effect. The net result is that a stable, secure, balanced system can be feasibly positioned upon a ceiling panel or baffle, while sound delivery from such a system, notably from the ceiling of a room, is markedly enhanced. Such combined advantages were never previously attained with ceiling mounted speakers, much less speaker components of the coaxial type.

BRIEF DESCRIPTION OF THE DRAWINGS

The present invention will be described in greater detail with reference to the accompanying drawings in which.

DESCRIPTION OF THE PREFERRED EMBODIMENTS

Figure 3:
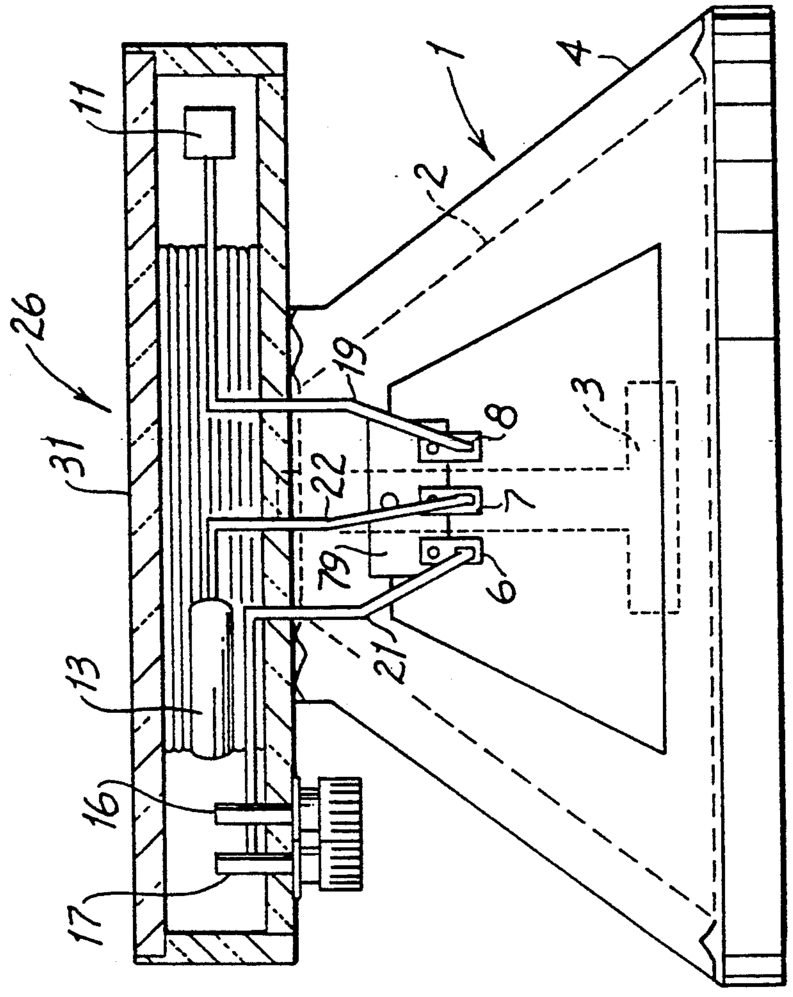
FIG. 3 is an elevational view in the direction of arrow S in FIG. 2 illustrating positioning of the inductance coil upon the coaxial speaker magnet.
Figure 4:
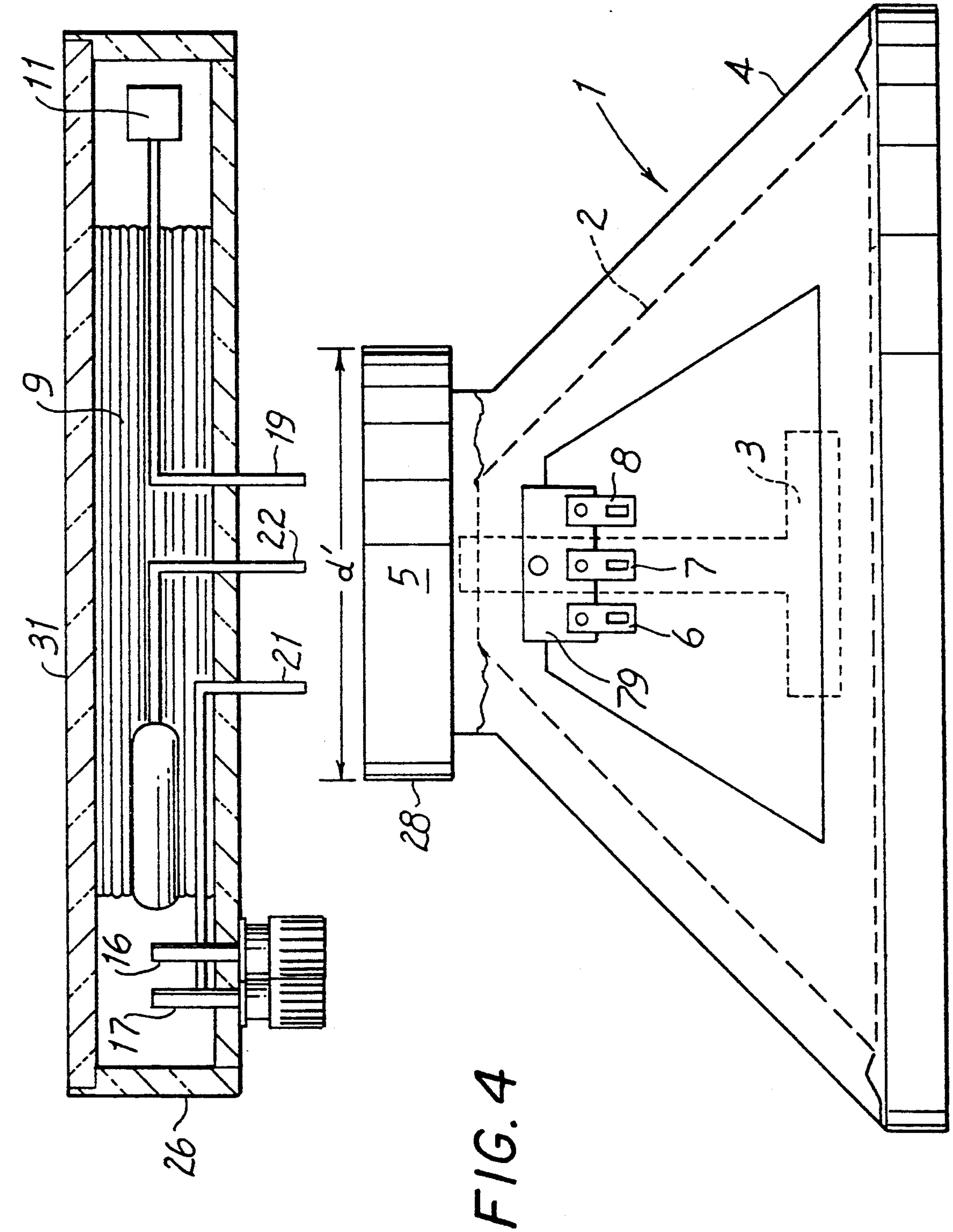
FIG. 4 is an exploded view similar to FIG. 3 and with component parts separated to enhance clarity of illustration.

Referring to FIGS. 1–4, the present invention is applied in conjunction with a coaxial speaker 1, which comprises a low frequency or full range component 2, commonly termed a woofer and a component 3 responsive only to higher frequencies, commonly termed a tweeter. The speaker components 2 and 3 are contained within a conically-shaped basket 4 and are mounted upon a permanent magnet 5 for the woofer 2 (FIG. 4). The tweeter 3 has its own permanent magnet which is not illustrated. The magnet 5 creates a repulsive force of electro-mechanical energy that is generated in a voice coil (not illustrated) within the cone of the woofer 2, i.e. the cone or diaphragm of the woofer 2 goes into motion by virtue of the repulsion. The tweeter 3 operates in similar fashion. Reference numerals 6, 7, and 8 denote lead connectors to the woofer and tweeter circuits and which are mounted upon a terminal 79.

Any conventionally available speaker such as a coaxial speaker can be utilized in accordance with the present invention, e.g., coaxial speakers manufactured by Mitek, Inc. (MTX), Chicago, Ill. For example, one such suitable speaker is a Mitek MTX Polyplex 5.3 coaxial speaker having a largest conical diameter (at the diaphragm of the larger woofer) of 5.3 inches, having a resistance of 4 ohms and a power rating of 30 watts rms continuous power and 60 watts rms maximum power. Another suitable speaker is a Mitek MTX 6.5 coaxial speaker having a maximum conical diameter (at the diaphragm of the larger woofer) of 6.5 inches, a resistance of 4 ohms, in addition to a power rating of 30 watts rms continuous power and 60 watts rms maximum power. However, it is emphasized that any compatible coaxial speaker, e.g., biaxial or triaxial, can be utilized in accordance with the present invention herein.

Figure 12:
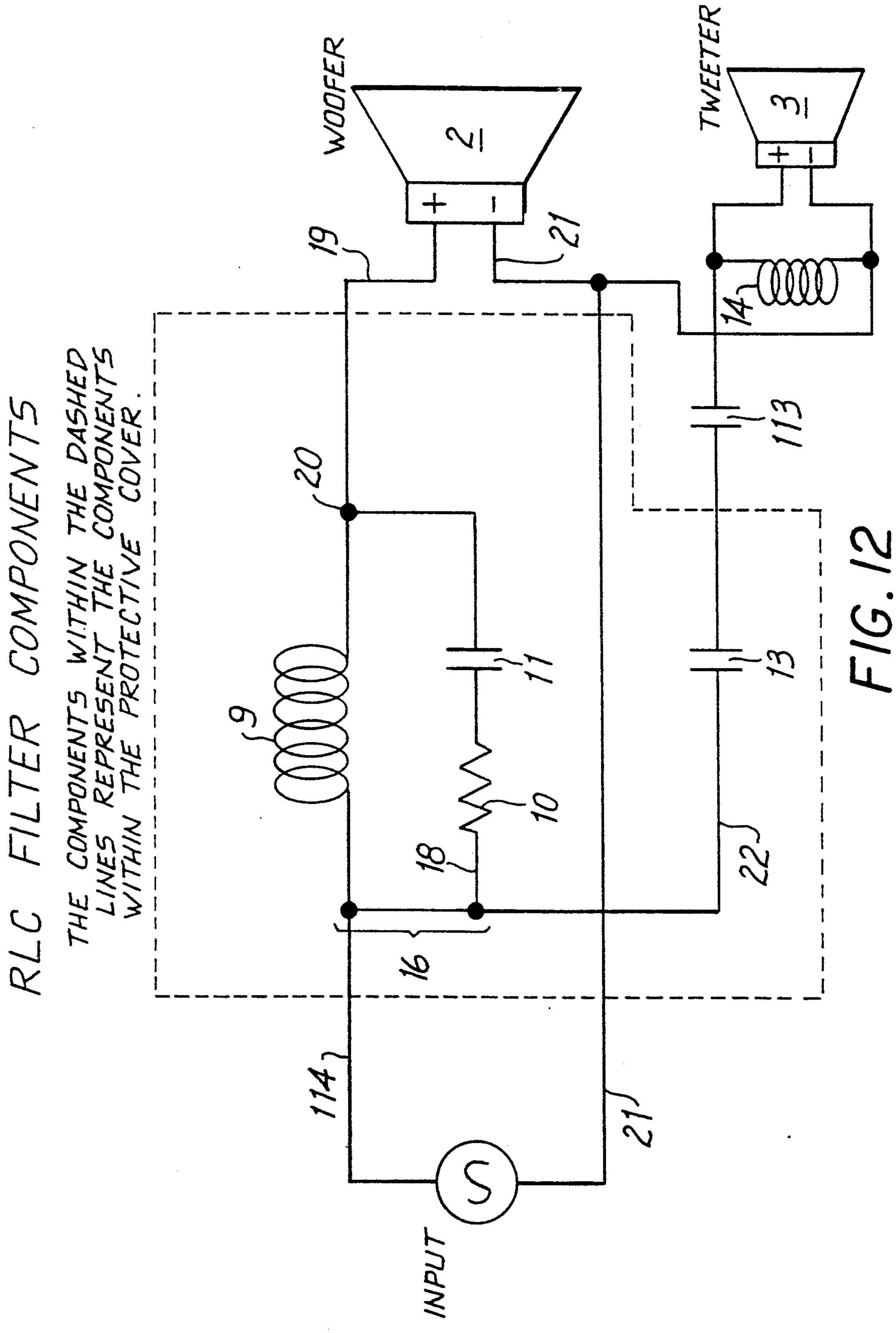
FIG. 12 is a schematic, diagrammatic view illustrating circuitry along with the various components thereof in accordance with the present invention as illustrated in FIGS. 2–4.

Referring, in particular, to FIG. 12, the electronic circuitry of the filtering network for the woofer and tweeter 3 is illustrated. More specifically, the filtering network comprises an inductance coil 9 connected in series with the woofer 2, and a resistor 10 and a capacitor 11 connected in parallel with the inductance coil 9. Basically this filtering circuit, commonly termed an RLC filtering circuit, functions in the following fashion.

Inductance is a property of electrical circuitry opposing initiation, termination, or alteration of current flow. In alternating current, the higher the frequency, the more frequent the current flow change. Therefore, the larger the inductance coil, the lower the frequency of current flow that will be affected, i.e., blocked by the coil. The resistor and capacitor serve to permit certain frequencies to bypass the effects of the inductor and enter the woofer. The smaller the capacitance, the higher the cutoff frequency, i.e. frequency cut off from entering the woofer. The higher the resistance, the lower the amplitude (db level) of frequency permitted to pass through the capacitor. Therefore, the inductance coil 9 blocks high range frequencies from reaching the woofer 2, the capacitor 11 blocks lower range frequencies, and the resistor 10 controls the amplitude of the higher range frequencies reaching the woofer 2.

Such blocked higher frequencies are then directed to the tweeter 3 which is coupled in parallel to the woofer 2 as illustrated, optionally through second and third capacitors 13, 113 with a second inductance coil 14 optionally being provided in parallel to shunt off lower frequencies away from the tweeter 3. The second and third capacitors 13, 113 and inductance coil 14 operate in similar fashion to the first capacitor 11 and coil 9 to allow only higher frequency current from an input 15 (e.g. an audio source) to reach the tweeter 3.

The proper inductance coil, capacitor, and resistor can be optimally selected for particular speaker components. In one preferred embodiment as illustrated in FIG. 12, the woofer 2 and tweeter 3 each have a respective resistance of 4 ohms, with the first inductance coil 9 providing an inductance of 2.5 mh, the resistor 10 providing a resistance of 15 ohms, the first capacitor providing a capacitance of 25 uf and, when required, the second and third capacitors providing respective capacitance of 12 uf and 6 uf, and the second inductor 14 providing an inductance of 0.17 mh. However it is noted that these values of the RLC filter circuitry can conveniently vary depending upon the size, the output of the coaxial speaker, and the shape of the structure upon which the speaker is mounted e.g., a ceiling baffle.

Figure 2:
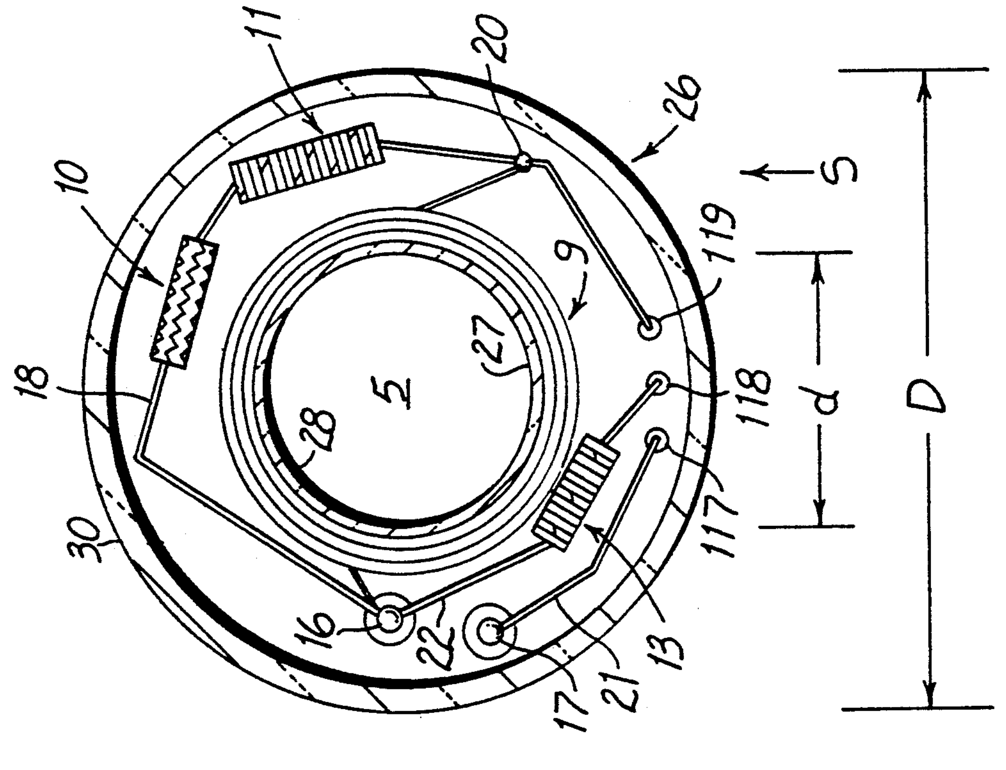
FIG. 2 is a top view of the present invention in the direction of arrow T in FIG. 1, more clearly illustrating the arrangement and mounting of various components forming the circuit of the present invention.

In accordance with the present invention, the magnetic inductance coil 9 is positioned upon the magnet 5 of the coaxial speaker 1, as illustrated in FIGS. 2–4, and is coupled through terminal 16 to wire 114 (not illustrated in FIG. 2) leading from input source 15 and at connection or welded junction 20 to wire 19 leading to the woofer 2. In this regard, resistor 10 and capacitor 11 are coupled along a separate line 18 to input terminal 16 at one end thereof and at an opposite end, to line 19 leading from inductor coil 9 to the woofer 2 at connection or welded junction 20. Line 19 is coupled to lead connector 8 of woofer 2, in turn coupled to a lead wire (not illustrated) leading into the woofer 2. Line 21 leads out of woofer 2 from connector 6 back to output terminal 17.

Additionally, if desired, RLC filter circuitry can be coupled to the tweeter 3. Basically, this is accomplished by a separate line 22 being coupled to input terminal 16 and leading from input terminal 16 through second and third capacitors 13, 113 to the tweeter 3. Line 22 is coupled to a line (not illustrated) leading to the tweeter 3 at the connector 7 in FIGS. 3 and 4 (third capacitor 113 and second inductance coil 14 are not illustrated in FIGS. 3 and 4). Furthermore, output line 23 leading from tweeter 3 is coupled to line 21 leading back to the input source 15 from the woofer 2, externally of a cover 26 for mounting of the RLC circuitry, as illustrated by the dotted lines in FIG. 12 and as explained further below. The inductance coil 9 is mounted within a cover 26 shaped and formed to snugly and securely fit upon the magnet 5 of coaxial speaker 1 as illustrated e.g., in FIGS. 2–4. More specifically, this cover 26 is annularly or concentrically shaped as illustrated, e.g. in FIGS. 2 and 4, having an outer diameter D and an inner diameter d substantially equal to the diameter d' of the speaker magnet 5 (the inner edge 27 of the cover 26 and the outer edge 28 of the magnet 5 are substantially complementary with one another to provide a snug fit). It should be noted that while the cover 26 is illustrated as having substantially circular cross section, the cover 26 may take any shape, e.g. oval, oblong, so long as the inner edge 27 of the cover 26 and the outer edge 28 of the magnet 5 are substantially complementary.

Any conventionally-available components can be used for the various components forming the RLC filtering network. For example, a TRW ceramic PW10 15 ohm 10% resistor and a capacitor having a value of 25 uf can be used in various combinations to provide the required resistance and capacitance as described above, while standard 18 gauge magnetic coil copper wire e.g., coated with enamel can be utilized as the inductance coil.

The cover 26 itself is designed to provide an annular receiving channel of about one inch in width for receiving the inductance coil 9. The cover 26 is also provided with an outer edge 30 for shielding the inductance coil positioned therewithin and a continuous top edge 31 for enhancing seating of the cover 26 upon the magnet 5. In this regard, the need for a continuous top edge 31 of the cover 26 is optional. In other words, the inner concentric area 132 for receiving the magnet 5 can be completely open or exposed, if desired. The cover 26 itself can be manufactured from any suitable electrically insulative material such as acrylic plastic or Bakelite (in the illustrated embodiment, the cover 26 is transparent).

Figure 1:
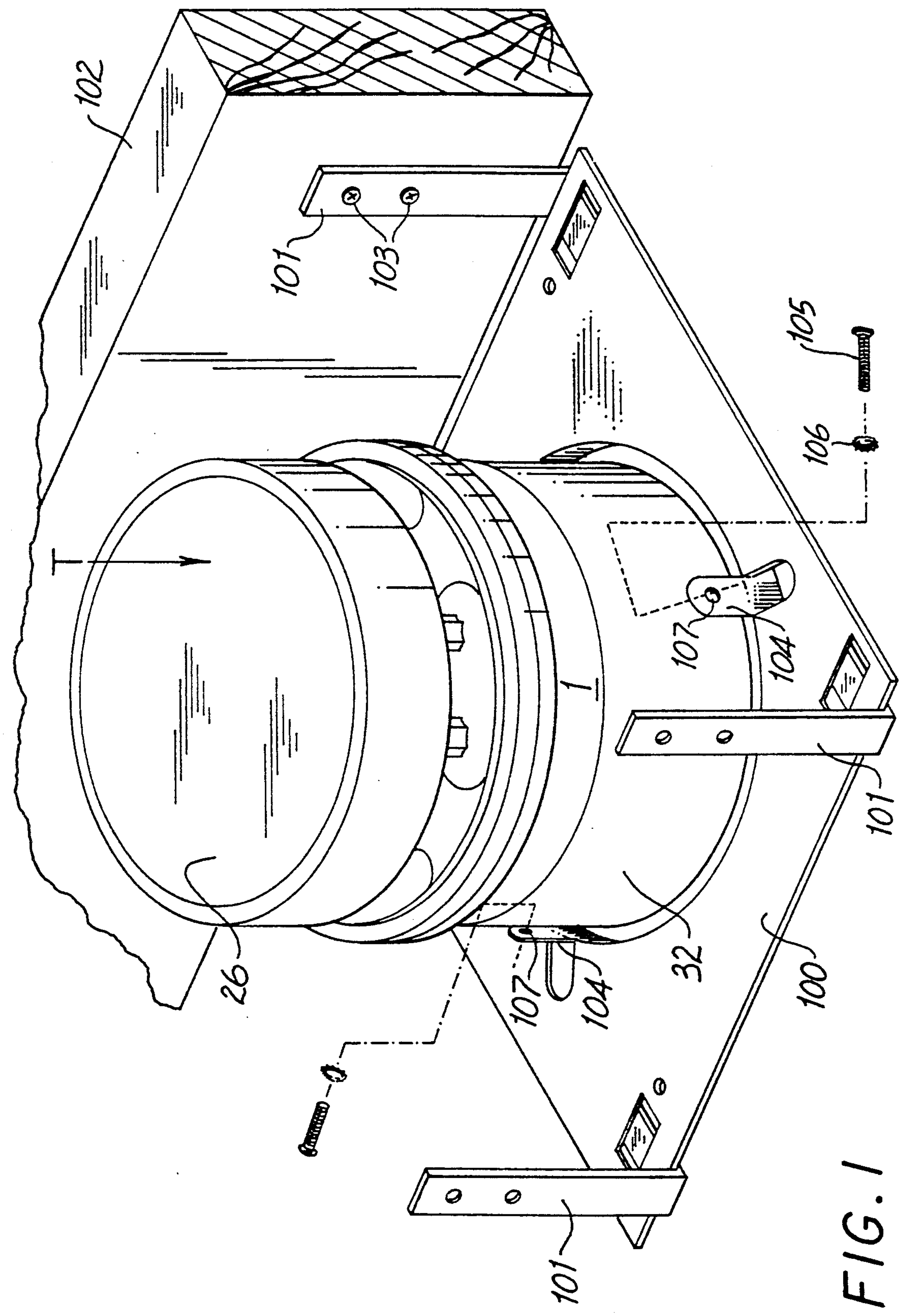
FIG. 1 is a perspective view of the present invention in which an inductance coil is mounted upon a magnet of a coaxial speaker which is, in turn, mounted on a baffle in turn positioned upon a panel such as a ceiling panel.

As noted above, it was previously thought that mounting of an inductance coil about a magnet, especially a permanent magnet, would hinder inductance. However, it has now been found that such inductance is not greatly hindered if at all, and that improved sound reception emanates from the coaxial speaker, especially when the speaker is mounted upon the ceiling, through a ceiling baffle 32 such as illustrated in FIG. 1. As a practical matter, it has been found that when the inductance coil 9 is mounted upon the magnet 5, the inductive magnetic field drops by about a few tenths of a millihenry, e.g. about a quarter of a millihenry, which can be compensated by increasing the number of windings of the inductance coil 9 within the cover 26. For example, if the coil 9, by itself, would provide inductance of about $2\frac{1}{2}$ millihenry, then the coil would have to be wound for about $2\frac{3}{4}$ millihenry to compensate for the loss of $\frac{1}{4}$ of a millihenry.

In this regard, it is emphasized that in the structure of the present invention, it is quite easy to simply increase the number of windings of the inductance coil 9 within the cover 26 to compensate for any loss of inductance. Such additional windings can quite easily fit within the cover 26 because the entire structure is extremely well-balanced as described further below. The amount of increase in windings itself is not too great. For example, if about 120 windings would be required, in and of itself, then the increase in windings would be about 10–20 or less to compensate for the inductance loss. The number of windings of the coil 9 will vary depending upon the desired frequency curve.

As noted above, the system and structure of the present invention is extremely well-balanced and can easily be mounted upon and secured to a panel such as a ceiling panel, especially through a ceiling baffle 32 as illustrated in FIG. 1. This ceiling baffle 32 itself can be constructed of any suitable material, such as aluminum. For example, such a baffle 15, conventionally available from ATLITE, Brooklyn, N.Y., one such baffle being denoted as ATLITE model A149. The baffle 32 itself is modified to accept the speaker, i.e. is shaved, chamfered, or otherwise cut down to provide requisite mounting therefor.

Figure 5:
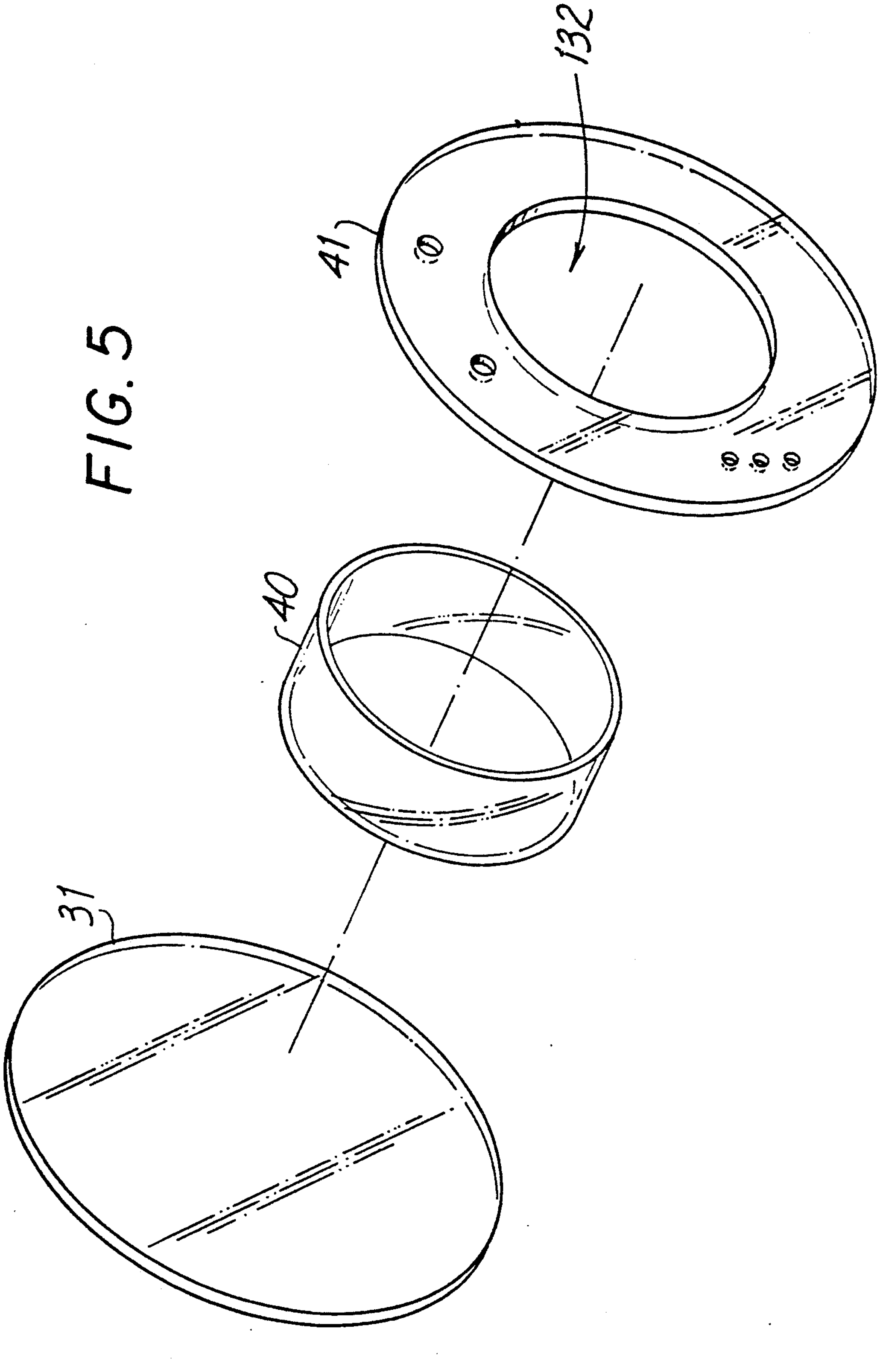
FIG. 5 is a schematic, perspective view illustrating assembly of mounting or support structure for the inductance coil in accordance with the present invention.

Installation of the filtering circuit upon a coaxial speaker and then mounting of the entire system onto a baffle, will now be described with reference to FIGS. 5–11. Initially, the cover 26, i.e. mounting or supporting structure for the inductance coil 19, is assembled by arranging cover 31, spindle 40, ad base 41 as illustrated in FIG. 5 with respect to one another and then joining these three sections together, e.g. by welding or applying appropriate adhesive.

Figure 6A:
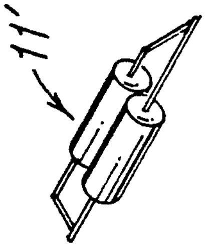
FIGS. 6A and 6B are perspective views of alternative electronic components which can be utilized in accordance with the present invention.
Figure 6B:
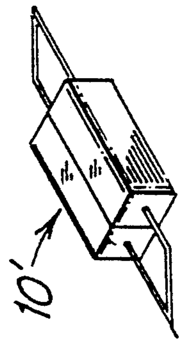
Figure 6:
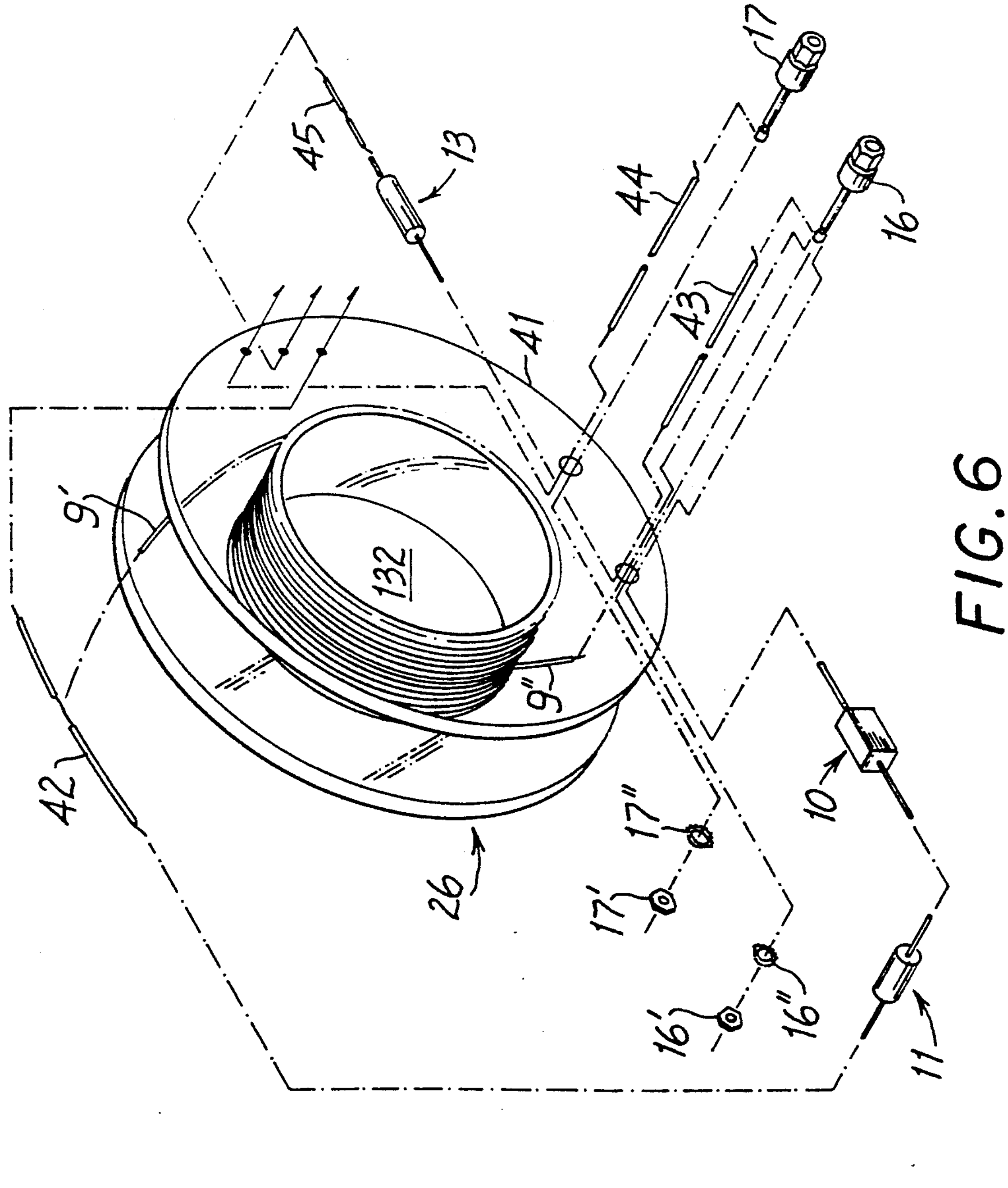
FIG. 6 is a schematic, perspective view illustrating mounting of circuitry including the inductance coil about the support structure in accordance with the present invention.

Then, the appropriate number of windings of magnetic inductance coil 9 are wrapped around the spindle portion 40 as illustrated in FIG. 6. Ends 9', 9" of coil 9 are welded or soldered to appropriate lines 42, 43 as illustrated by the dotted lines in FIG. 6, with lines 43, 44 and 45 also being positioned within the cover 26 as illustrated in this figure. These lines 42, 43, 44 and 45 each carry insulation as illustrated. Resistor 10, capacitor 11, and second capacitor 13 are joined together to respective lines 42, 45, and terminal 16 as illustrated by the dotted lines and arrows in FIG. 6, with terminal 17 also being provided and connected as illustrated. These two terminals 16 and 17 are secured to base 41 by nuts 16', 17', and washers 16", 17". Capacitor 11 and resistor 10 can be replaced by an appropriate parallel pair 11' of capacitors and parallel pair 10' of resistors respectively, as illustrated in FIGS. 6A and 6B.

Figures 7, 8:
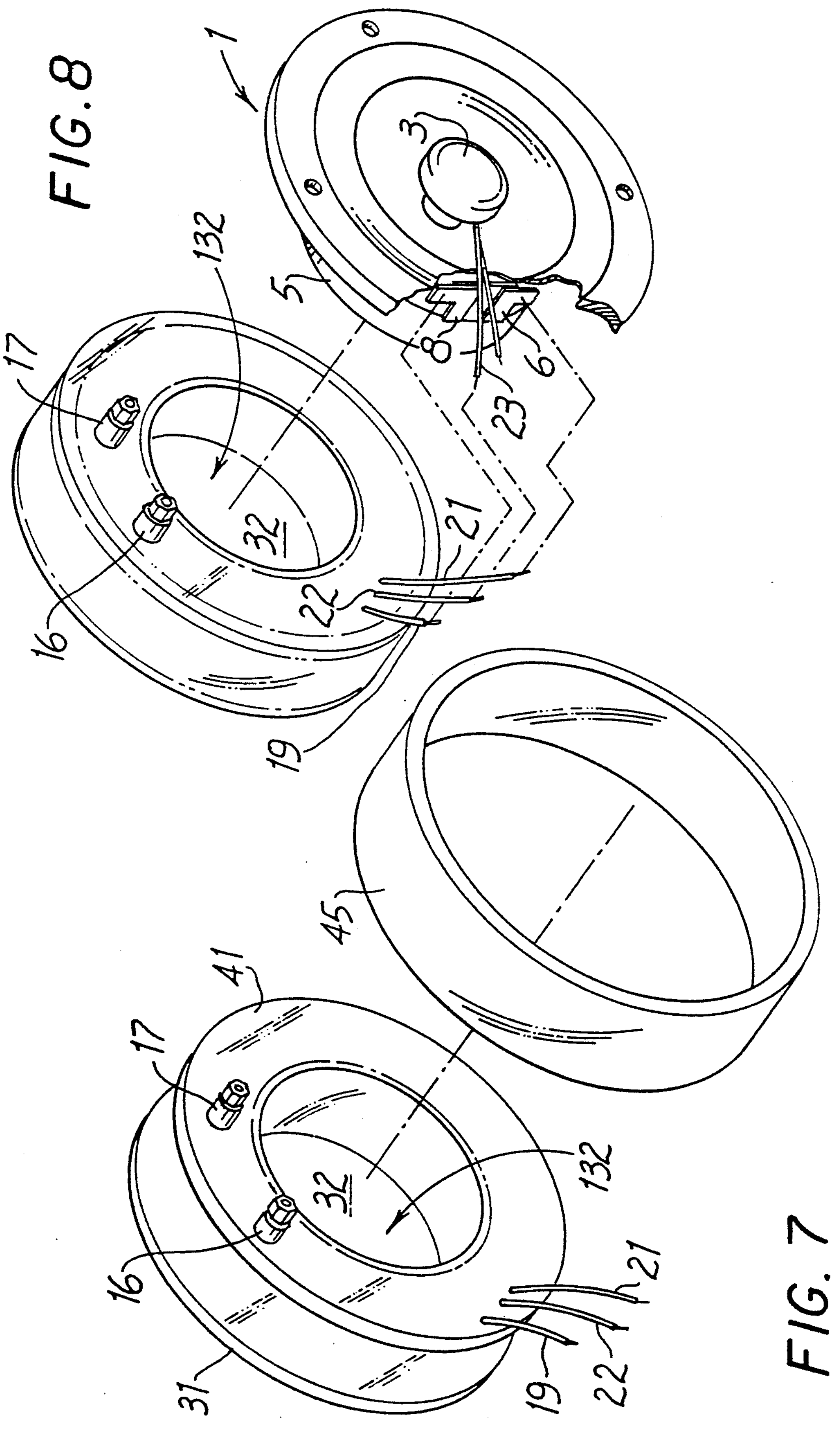
FIG. 7 is a schematic, perspective view illustrating retention of the mounted circuitry about the supporting structure of FIG. 6, in accordance with the present invention.
FIG. 8 is a schematic, perspective view illustrating mounting of the assembled circuitry, including the supporting structure therefor, about a magnet of a coaxial speaker in accordance with the present invention.
Figure 9:
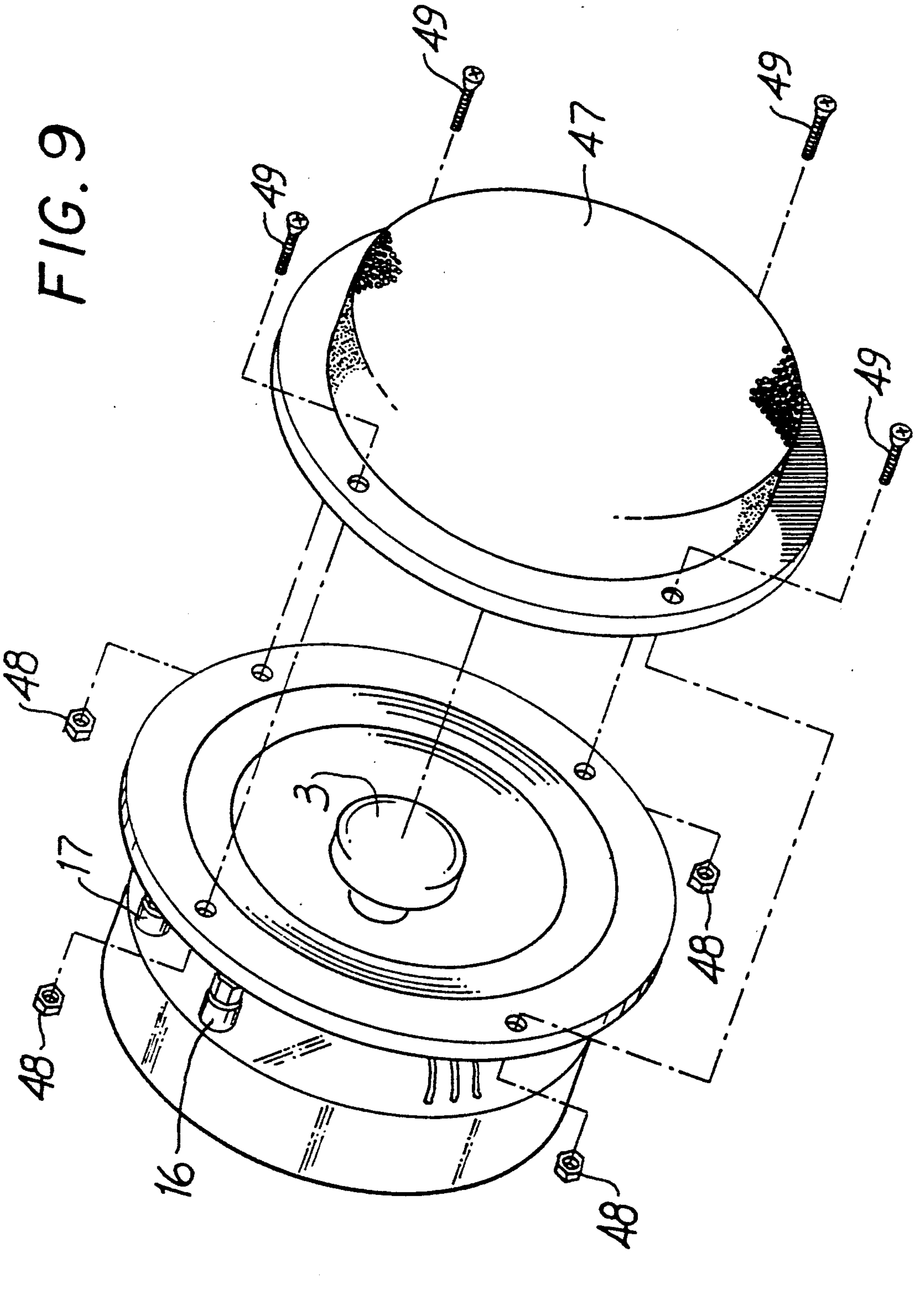
FIG. 9 is a schematic, perspective view illustrating mounting of a protective grill about the coaxial speaker of FIG. 8, in accordance with the present invention.

Then, the entire mounted covering 26 with the three lead lines 21, 22 and 19 protruding therefrom, is affixed within an outer sleeve or collar 45, also transparent as illustrated in FIG. 7, to form the final mounting or supporting structure 26 for the filtering circuitry, which is then mounted upon the magnet 5 of the speaker 1 as illustrated in FIG. 8, with lead lines 21 and 19 connected to appropriate connectors 6 and 8 and lead line 21, in this instance, lead directly to the tweeter 3. Reference numeral 23 in FIG. 8 denotes exit line 23 leading directly out of the tweeter 3. An appropriate grillwork shield 47 is then affixed to the speaker 1 by appropriate nuts 48 and bolts 49 as illustrated in FIG. 9 to protect the respective speaker cones.

Figure 10:
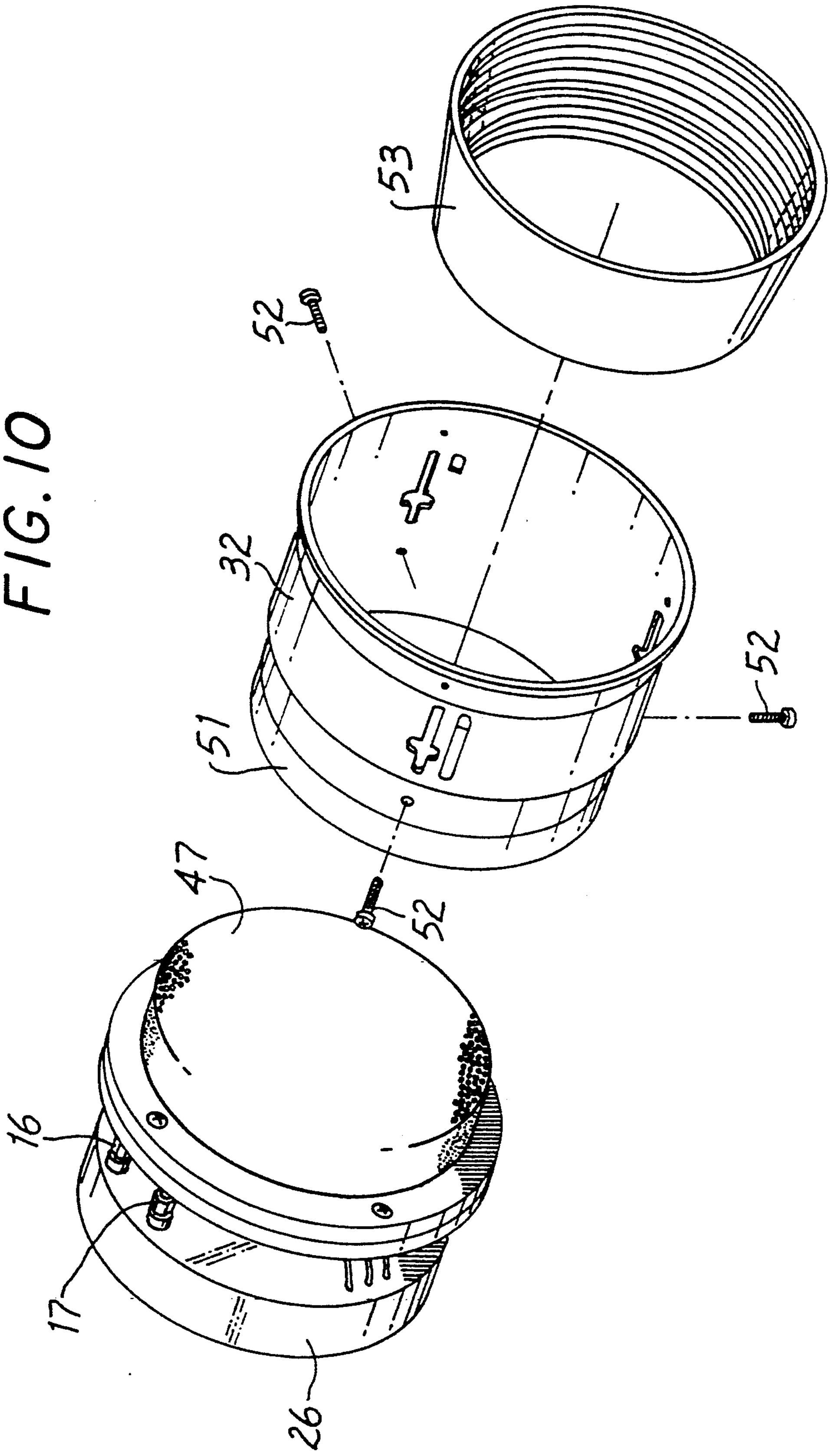
FIG. 10 is a schematic, perspective view illustrating mounting of the assembled speaker of FIG. 9 including the filtering circuit therefor onto a supporting baffle in accordance with the present invention.
Figure 11:
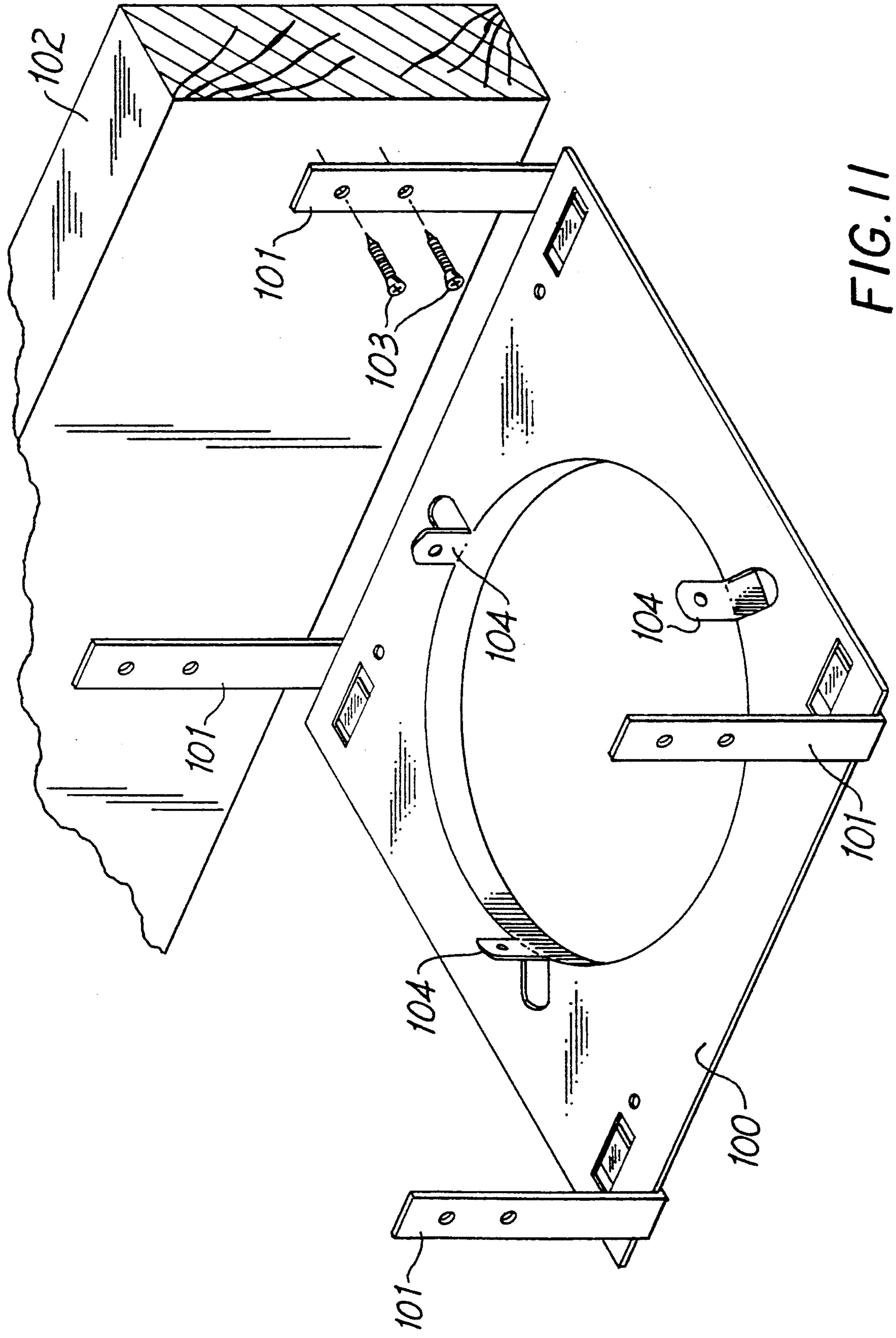
FIG. 11 is a schematic, perspective view illustrating assembly of a supporting ceiling panel on which the baffle, speaker, and filtering circuit of FIG. 9 are mounted in accordance with the present invention as illustrated in FIG. 1.

The entire speaker system is then mounted upon the baffle 32 as illustrated in FIG. 10, the baffle 32 having been appropriately cut or trimmed at a top edge 51 thereof, to receive the speaker system. The baffle 32 and speaker system are secured together with appropriate bolts 52. An inner conical shield 53 an also be snapped into the baffle 32 as illustrated in FIG. 10. A ceiling panel 100 formed, e.g. of metal, is erected as illustrated in FIG. 11. More specifically, brackets 101 are appropriately affixed to the ceiling panel 100, e.g., by screws (not illustrated), and can then be secured to a cross beam 102 within the ceiling by appropriate screws 103 as denoted by the dotted lines in FIG. 11. Flanges 104 are punched out and bent up from panel 100 as illustrated in FIG. 11 for securing the baffle 32 as part of the entire speaker system as illustrated in FIG. 1. More specifically, the baffle 32 is secured from within by bolts 105 and washers 106 directed outwardly and through holes 107, as denoted by the dotted lines in FIG. 1.

In this regard, it is especially emphasized that with the present invention, lighting baffles in a ceiling can be easily converted to speaker baffles because the present system is extremely well-balanced and will stably seat on top of the ceiling baffle 32. Previously, it wa not at all practical to directly incorporate RLC circuitry upon a ceiling mounted speaker having severely limited space such as the new "designer" type baffles because it was structurally unsound to do so. The only possibility involved mounting an extremely remote RLC circuit in a separate box, e.g. on a wall in a room, which was totally impractical and inadequate for filtering the sound. Therefore, the present invention provides improved filtering of sound in addition to space savings, to be discussed further below. The cover 26 can be attached to the magnet 5 by screwing thereonto, or by affixing with an adhesive.

In the embodiments illustrated in FIGS. 5–11, the baffle 32 has a length of about three inches from the panel 100 on which the baffle sits to the diaphragm of the speaker 1. The baffle 32 may take any convenient length as required, however it is noted that this length of the baffle 32 will affect the quality of the sound emitted from the speaker for the following reason. The filtering circuitry should be tuned to compensate for any range of frequency that is adversely affected by the baffle length or depth. This is accomplished by adjusting capacitance and/or resistance of the filtering circuitry. However, as noted above, it was never previously feasible to reliably and effectively incorporate the RLC filter circuitry directly upon the speaker 1, and such filter circuitry had to be provided remotely to the speaker 1, if at all, so that sound quality emanating from a ceiling mounted coaxial speaker, especially one situated upon a ceiling baffle, never provided optimum quality.

Such required tuning can be accomplished in easy fashion with an audio frequency spectrum analyzer and generator. Basically, this involves coupling a spectrum analyzer, a microphone which receives output from the speaker, resulting in a visual presentation of the frequency response of the speaker as a sign wave or a bar graph. Analysis range should start at low frequencies, e.g. around 20 Hz., and range up to high frequencies, e.g. around 20,000 Hz. If the amplitude is objectionably pronounced or high for any particular frequency range, then the filtering circuit should be tuned to compensate for it.

Figure 13:
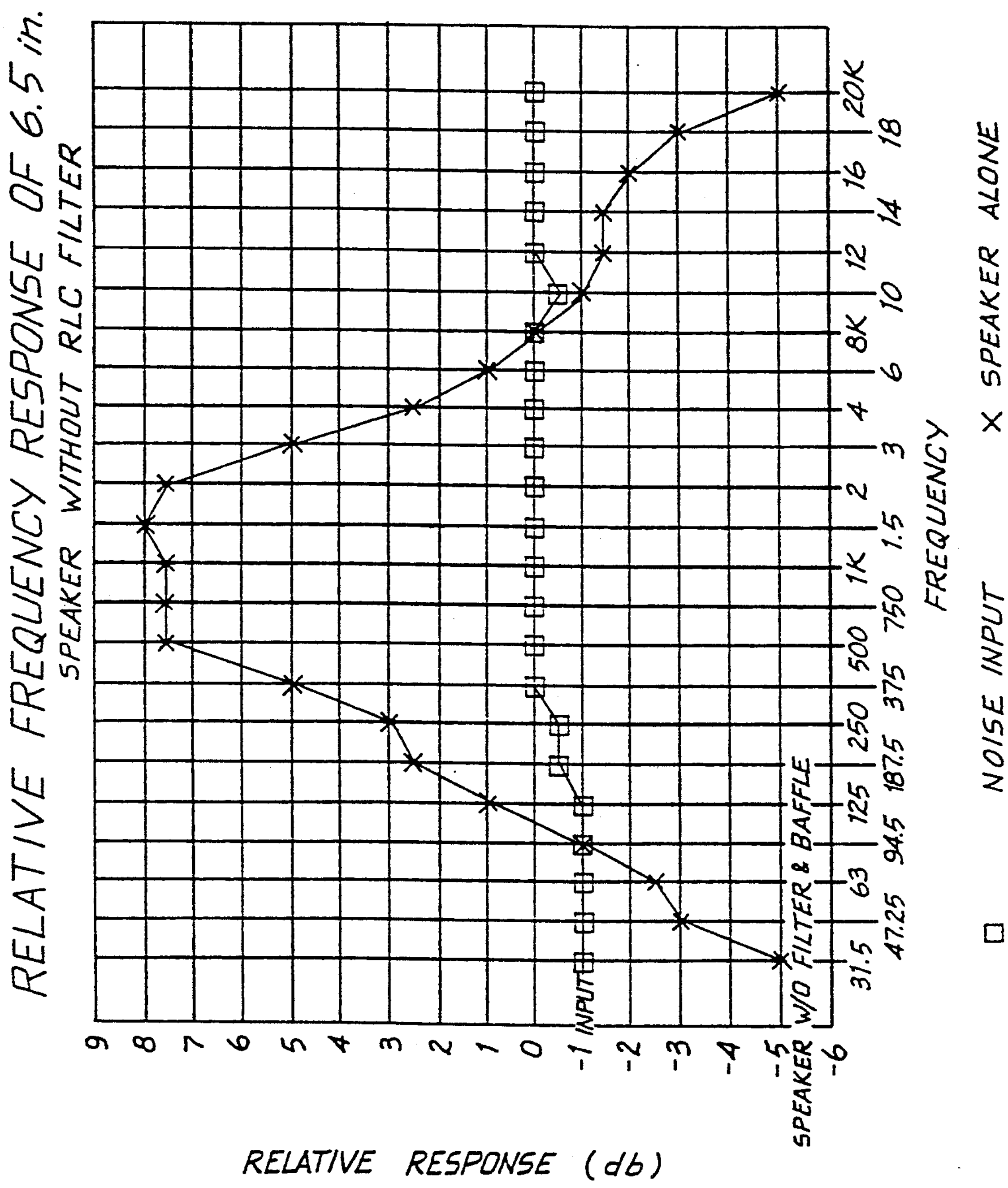
FIGS. 13–16 are graphs illustrating the performance of the present invention as part of an audio system.
Figure 14:
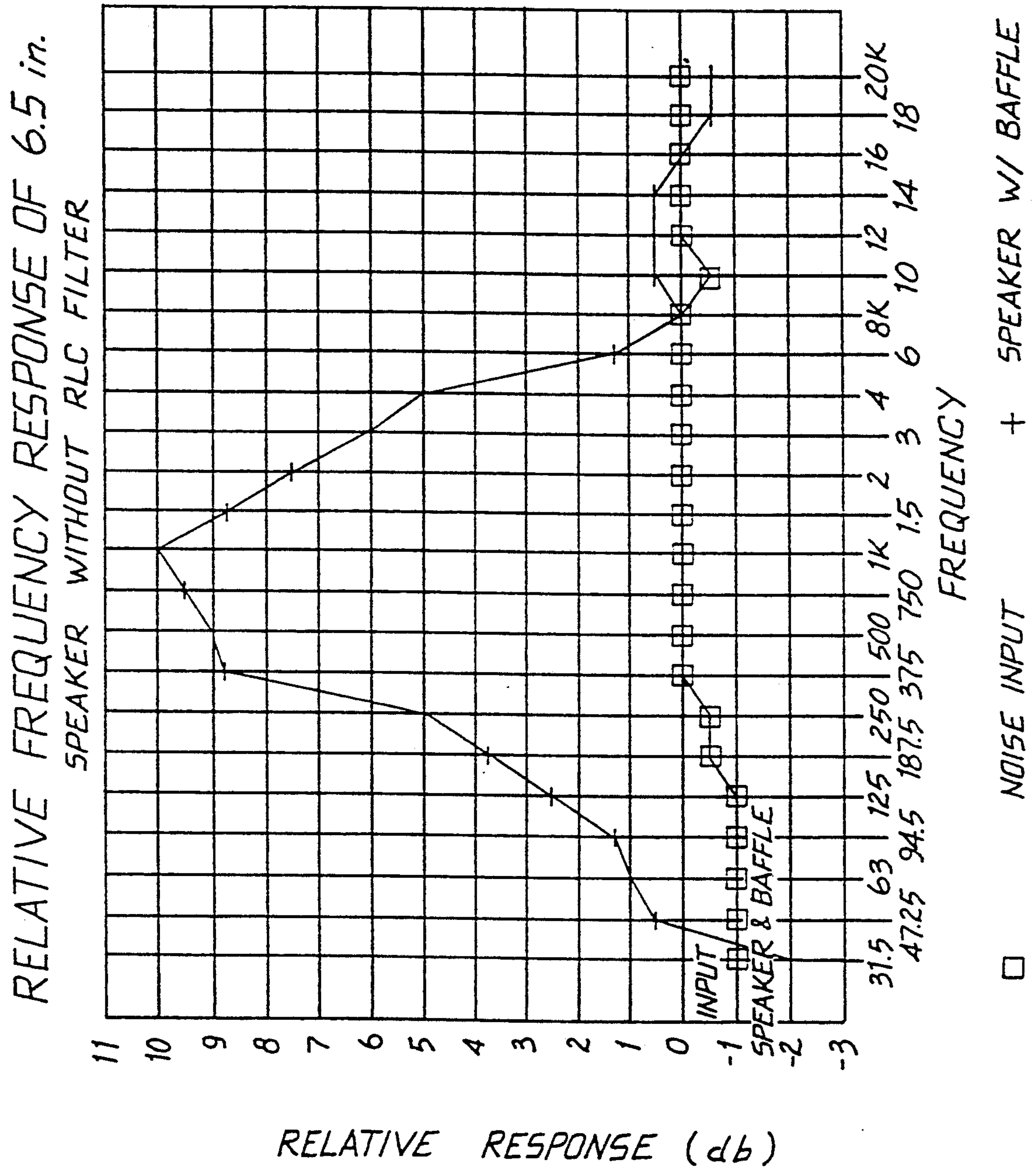

In this regard, attention is directed to accompanying graphs in FIGS. 13-16 illustrating frequency response over various ranges of frequencies, for different kinds of speaker constructions. FIG. 13 illustrates frequency response of a particular speaker alone while FIG. 14 illustrates the frequency response for that same speaker when provided with a baffle (6.5 in. denotes the diameter of the woofer basket 4). As can be seen, the amplitude actually rises over the midrange frequency of 95 Hz to 6,000 Hz, resulting in exaggerated midrange amplitude.

Figure 15:
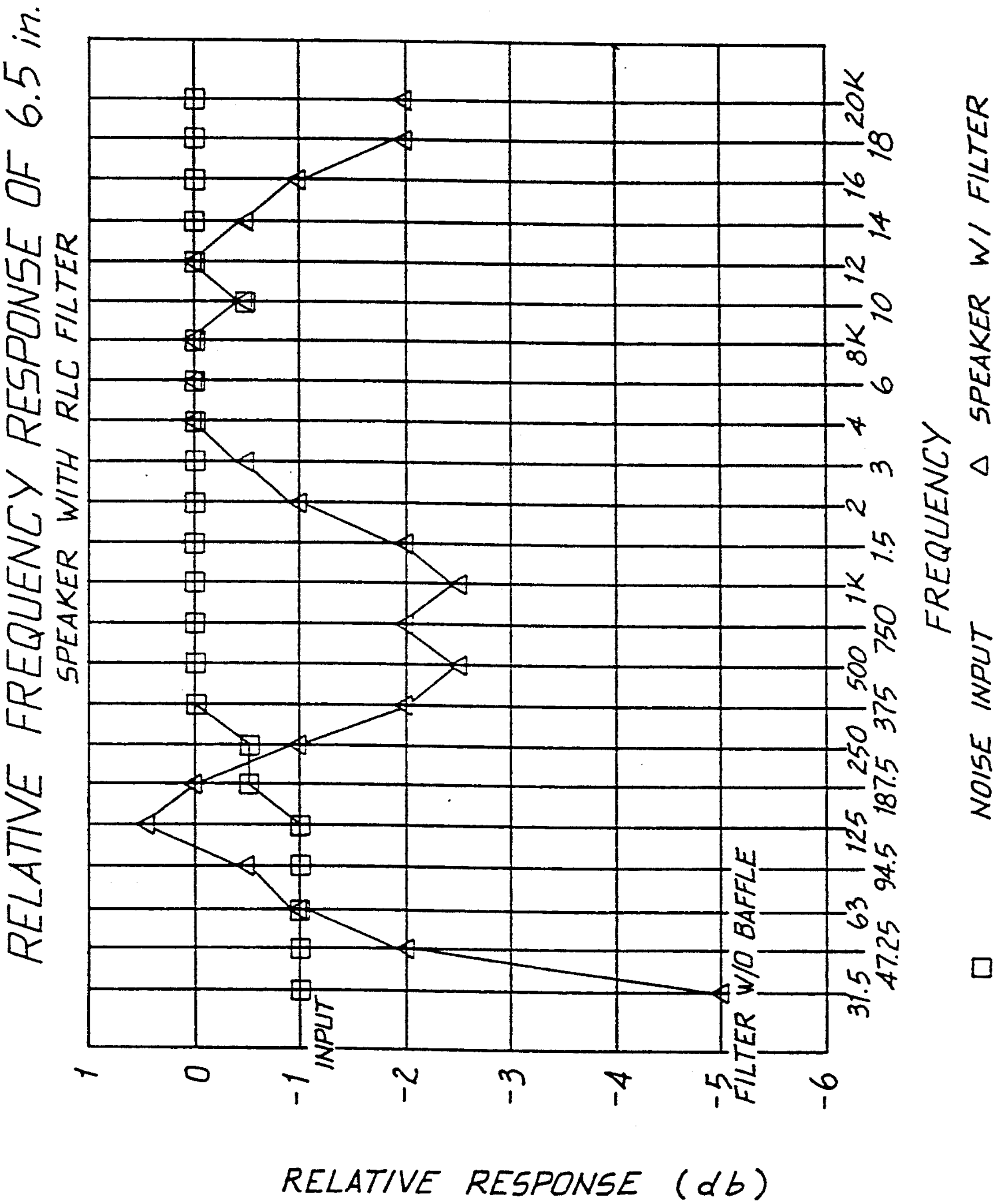
Figure 16:
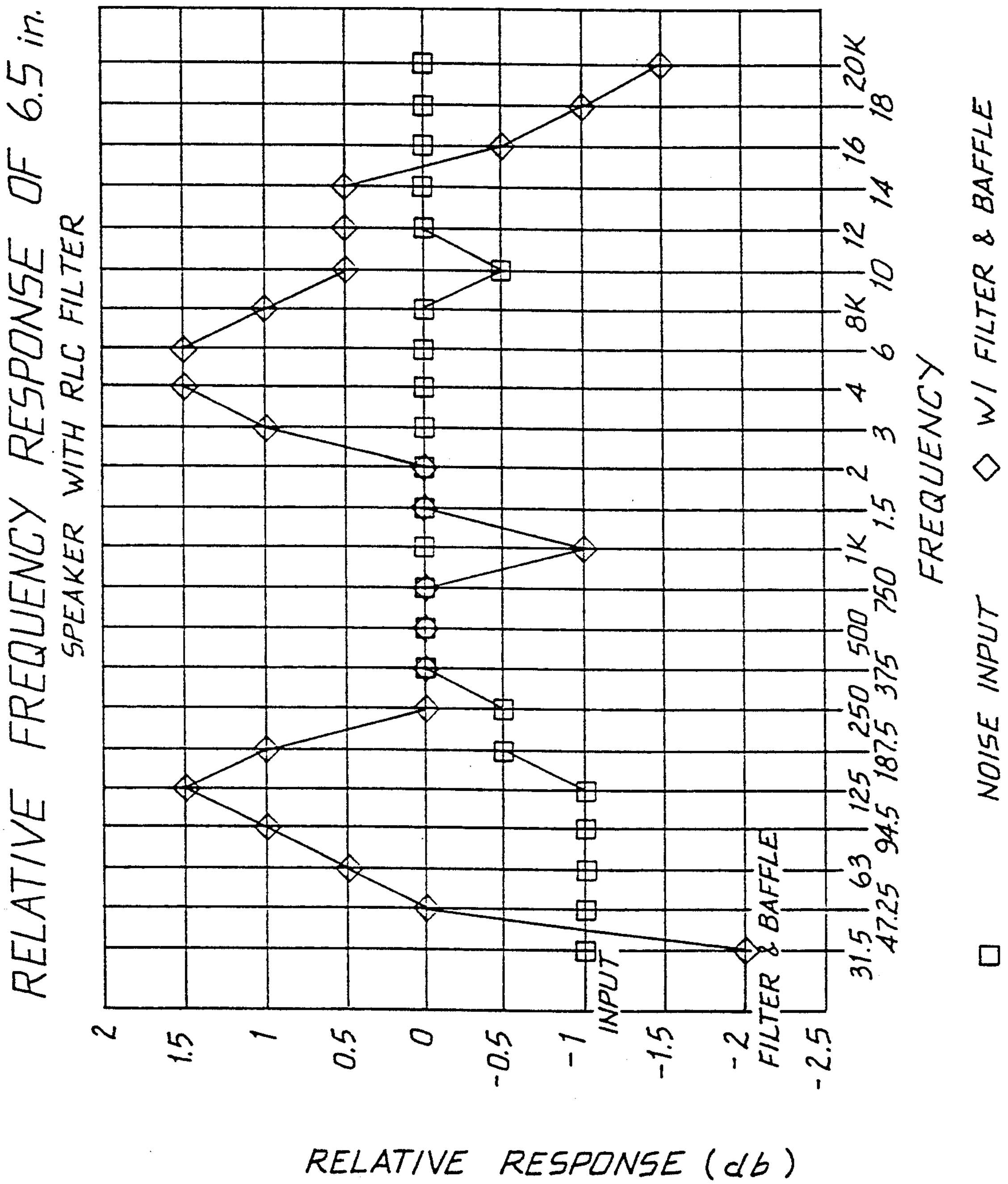

When an RLC filtering network of FIG. 12 was coupled to the speakers, then as illustrated in FIG. 15, the midrange response drops below low and high frequency amplitude. When filtered speakers are mounted on a baffle, then as illustrated in FIG. 16, the midrange amplitude rises back to a desired level, i.e. over about 0-1 db. Loudness and concomitant distortion over these midrange frequencies are minimized or eliminated altogether.

Accordingly, the present invention provides enhanced, improved audio reception from a coaxial speaker, especially when such speaker is mounted upon a ceiling baffle. The ceiling baffle may have any desired length or depth dimension which was previously considered unusable, because the speaker components can be easily tuned by the filtering network to compensate for any distortions caused by the baffle.

The preceding description of the present invention is merely exemplary and is not intended to limit the scope thereof in any way.

What is claimed is:

1. A filtering circuit for a coaxial speaker, which comprises an inductance coil, shaped and positioned to fit over a magnet of said coaxial speaker, said coaxial speaker comprising a high frequency component and a low frequency component connected in parallel with one another, with said inductance coil being connected in series with said low frequency component, and additionally comprising a mounting cover for said inductance coil, said mounting cover being concentrically shaped and arranged to be removably mounted upon the magnet of the coaxial speaker, and a resistor and a capacitor arranged in parallel with respect to said inductance coil and also mounted within said cover to further tune said low frequency component.

2. The circuit of claim 1, wherein said mounting cover comprises a tubular section defining an opening for receiving the magnet, with said inductance coil wound about said tubular section, and flanges at opposite ends of said tubular section for retaining said coil within said cover.

3. The circuit of claim 1, additionally comprising at least one additional capacitor connected in series with a positive terminal of said high frequency component, connected to a positive terminal of the filtering circuit encompassing said resistor, capacitor and inductance coil mounted within said cover, and also mounted within said cover.

4. The circuit of claim 3, additionally comprising a second inductance coil connected in parallel with the positive terminal of said high frequency component.

5. A filtering circuit for a coaxial speaker which comprises an inductance coil shaped and positioned to fit over a magnet of said coaxial speaker, said coaxial speaker comprising a high frequency component and a low frequency component connected in parallel with one another, said inductance coil being connected in series with said low frequency component, and a mounting cover for said inductance coil concentrically shaped and positioned to be removably mounted upon the magnet of the coaxial speaker and having a tubular section defining an opening for receiving the magnet and about which said coil is wound and flanges at opposite ends of said tubular section for retaining said coil within said cover, said filtering circuit adapted to provide a certain db level over a midrange frequency between said high frequency and low frequency components.

6. A speaker system, which comprises a speaker having a magnet mounted at one end thereof, and a filtering network for said speaker, said filtering network comprising an inductance coil mounted upon said magnet of said speaker, wherein said speaker is a coaxial speaker comprising a high frequency component and a low frequency component connected in parallel with one another, with said inductance coil being connected in series with said low frequency component, and said system being adapted to be tuned by said filtering network to provide a certain db level over a midrange frequency between said high frequency and low frequency components.

7. The system of claim 6, additionally comprising a mounting cover for said inductance coil, said mounting cover being concentrically shaped and arranged to be mounted upon the magnet of said coaxial speaker.

8. The system of claim 7, additionally comprising a resistor and a capacitor arranged in parallel with respect to said inductance coil and also mounted within said cover.

9. The system of claim 8, wherein said mounting cover comprises a tubular section defining an opening for receiving the magnet, with said inductance coil wound about said tubular section, and flanges at opposite ends of said tubular section for retaining said coil within said cover.

10. The system of claim 8, additionally comprising at least one additional capacitor connected in series with a positive terminal of said high frequency component, connected to a positive terminal of said filtering network encompassing said inductance coil, resistor and capacitor mounted within said cover, and also mounted within said cover.

11. The system of claim 10, additionally comprising a second inductance coil mounted in parallel with said positive terminal of said high frequency component.

12. The system of claim 6, additionally comprising a supporting baffle upon which said speaker is arranged to be mounted at an end opposite said mounting of said inductance coil.

13. The system of claim 12, wherein said baffle is shaped to be mounted upon a supporting structure at an end thereof opposite said mounting of said speaker.

14. The system of claim 13, wherein said structure is a ceiling panel.

* * * * *